United States Patent [19]
Aeugle

[11] Patent Number: 5,969,405
[45] Date of Patent: Oct. 19, 1999

[54] INTEGRATED CIRCUIT STRUCTURE HAVING AN ACTIVE MICROWAVE COMPONENT AND AT LEAST ONE PASSIVE COMPONENT

[75] Inventor: Thomas Aeugle, München, Germany

[73] Assignee: Seimens Aktiengesellschaft, Munich, Germany

[21] Appl. No.: 08/793,969

[22] PCT Filed: Sep. 6, 1995

[86] PCT No.: PCT/DE95/01213

§ 371 Date: Mar. 7, 1997

§ 102(e) Date: Mar. 7, 1997

[87] PCT Pub. No.: WO96/08843

PCT Pub. Date: Mar. 21, 1996

[30] Foreign Application Priority Data

Sep. 14, 1994 [DE] Germany ............................ 44 32 727

[51] Int. Cl.$^6$ ................ H01P 1/15; H01P 3/08; H01L 29/00
[52] U.S. Cl. ............ 257/531; 257/532; 257/275; 336/200; 333/247
[58] Field of Search ............................ 257/275, 531, 257/532, 728, 723, 724, 379, 528; 331/108 C, 108 D, 99, 117 FE, 117 D, 117 R; 336/200; 333/246, 247

[56] References Cited

U.S. PATENT DOCUMENTS

| | | | |
|---|---|---|---|
| 4,048,646 | 9/1977 | Ogawa et al. | 257/531 X |
| 4,969,032 | 11/1990 | Scheitlin et al. | 257/275 |
| 5,063,177 | 11/1991 | Geller et al. | 438/107 |
| 5,162,258 | 11/1992 | Lemnios et al. | 438/10 |
| 5,481,131 | 1/1996 | Studinger et al. | 257/531 |
| 5,635,762 | 6/1997 | Gammand | 257/728 |

FOREIGN PATENT DOCUMENTS

0495206 A2  7/1992  European Pat. Off. .

WO 92/05580  2/1992  WIPO .

OTHER PUBLICATIONS

A. C. Reyes, et al., "Silicon as a Microwave Substrate," Microwave Symposium Digest, IEE MTT–S International, Apr. 1994, pp. 1759–1762.
M. H. Hanes, et al, "MICROX—An All–Silicon Technology for Monolithic Microwave Integrated Circuits," IEEE Electron Device Letters, vol. 14, No. 5, May 1993, pp. 219–221.
Patent Abstracts of Japan, vol. 17, No. 261, (E–1369), May 21, 1993 & JP–5003403, Jan. 8, 1993.
Patent Abstracts of Japan, vol. 8, No. 39 (3–228), Feb. 21, 1984 & JP–58197762, Nov. 17, 1983.
IEEE Transactions on Microwave Theory and Techniques, vol. 39, No. 5, May 1991, H.H. Meinel, Millimeter–Wave Technology Advances Since 1985 and Future Trends, pp. 759–767.
IEEE Transactions on Microwave Theory and Techniques, vol. MTT–31, No. 7, Jul. 1983, D.F. Williams et al, Design and Performance of Coplanar Waveguide Bandpass Filters, pp. 558–566.
Gallium Arsenide, Edited by M.J. Howes et al, 1985 John Wiley & Sons Ltd., Chapter 12, D. Maki, GaAs Microwave Monolithic Circuits, pp. 453–454.

*Primary Examiner*—John Guay
*Attorney, Agent, or Firm*—Hill & Simpson

[57] ABSTRACT

Integrated circuit structure having an active microwave component and at least one passive component.

A high-resistance silicon substrate (11) comprises an active microwave component (16) and at least two metallization planes (12, 14), which are insulated from one another by an insulation layer (13). A passive component surrounded by a grounded line (122) in one of the metallization planes (12) is provided, which comprises a first metal structure (121), which is realized in the first metallization plane (12), and a second metal structure (141), which is realized in the other metallization plane (14). The passive component is designed, in particular, as a capacitor, coil or resonator which comprises a capacitor and a coil.

7 Claims, 3 Drawing Sheets

INTEGRATED CIRCUIT STRUCTURE HAVING AN ACTIVE MICROWAVE COMPONENT AND AT LEAST ONE PASSIVE COMPONENT

BACKGROUND OF THE INVENTION

Microwave circuits, often also referred to as millimeter wave circuits, require passive components in addition to active microwave components. Capacitors or coils, which are used to construct filters, are referred to, for example, as passive components.

Furthermore, resonators are required to select a narrow high-frequency band from the frequency spectrum emitted by the active microwave component.

IMPATT diodes, Gunn diodes or fast transistors, in particular heterojunction bipolar transistors and high-frequency MOS transistors, are usually used as active microwave components.

During the operation of the microwave circuit at high frequencies, in particular above 50 GHz, parasitic effects are produced as a result of the geometry of the passive components. The result of these parasitic effects is that the coils and capacitors no longer behave like coils and capacitors.

For this frequency range, filters are mainly constructed as line length component. In this case, the line is interrupted to produce a gap. If the length of the gap in the propagation direction of a wave is $\lambda/2$, then a wave having the wavelength $\lambda$ is transmitted, whereas other wavelengths are reflected at the gap. The space requirement of line length components of this type is linked to the wavelength and hence to the frequency.

Slot-type resonators or planar disk-type resonators are used as resonators in this frequency range. Slot-type resonators again designate gaps in lines, which have an extent corresponding to an integer multiple of $\lambda/2$. For impedance reasons, gaps having an extent of integer multiples of A are preferable here. The dimensions of a slot-type resonator are therefore again coupled to the wavelength.

Planar disk-type resonators designate enlargements of the line cross-section which are in disk form. Resonance occurs for specific cross-sections of such disks.

Microwave circuits are mainly constructed using conventional stripline technology (see, for example, H. H. Meinel, Millimeter-Wave Technology advances since 1985 and Future trends, IEEE Transaction on microwave theory and techniques, Vol. 39, No 5, 1991, pages 759 to 767). In stripline technology, the electromagnetic field propagates between a stripline and a grounded metal plate. The grounded metal plate and the stripline are in this case arranged on opposite surfaces of an insulating substrate, for example of a printed circuit board. The packing density of the striplines is in this case limited by lateral field components. Furthermore, the impedance of the stripline is greatly dependent on the substrate thickness, with the result that fluctuations in the substrate thickness have a noticeably disturbing effect.

The problem of fluctuations in the substrate thickness is avoided by the use of coplanar lines, as is disclosed, for example, in D. F. Williams et al., Design and performance of coplanar wave guide bandpass filters, IEEE Transaction on microwave theory and techniques, Vol. MTT-31, No 7, 1983, pages 558 to 565. Lines which run between grounded lines are arranged on an insulating substrate, generally composed of high-resistance GaAs. The electromagnetic field in this case propagates between the line and the grounded lines. The substrate is essentially used for mechanical stabilization.

The lines are produced on GaAs substrates using electroplating technologies, which can be structured relatively coarsely. In this way, it is possible to produce structures having a structure size of greater than 5 $\mu$m.

Hybrid superstructures are used for many high-frequency applications, for example Doppler radar.

SUMMARY OF THE INVENTION

The invention is based on the problem of specifying an integrated circuit arrangement having an active microwave component and a passive component which can be used for frequencies above 50 GHz and in which the space requirement of the components is further reduced compared with the prior art.

The integrated circuit structure is constructed on a substrate made of high-resistance monocrystalline silicon. The substrate has, in particular, a resistivity of $\geq 1000$ $\Omega$cm. Silicon substrates of this type have recently become available on account of improved crystal growth methods.

The substrate comprises an active microwave component, in particular an IMPATT diode, a Gunn diode, a heterojunction bipolar transistor or a high-speed MOS transistor. The substrate is furthermore provided with at least two metallization planes, which are insulated from one another by means of an insulation layer. The passive component is realized by metal structures in the two metallization planes.

One of the metal structures is in this case arranged between grounded lines which are realized in the same metallization plane as the relevant metal structure. The circuit structure according to the invention is consequently constructed in a coplanar manner.

According to one embodiment of the invention, the passive component is designed as a capacitor. In this case, a first electrode of the capacitor is arranged in one metallization plane and a second electrode of the capacitor is arranged in the other metallization plane. The first electrode and the second electrode of the capacitor overlap. The insulation layer arranged in between forms the dielectric. The capacitor electrodes make contact with line structures respectively realized in the other metallization plane by means of contacts consisting of filled contact holes in the insulation layer.

According to another embodiment of the invention, the passive component is designed as a coil. For this purpose, a first metal structure is designed as a conductor track arranged in the form of a spiral in a first metallization plane. In this connection, in the form of a spiral refers both to an arrangement which has a round cross-section in each individual turn and to an arrangement which has an angular, in particular rectangular, cross-section in each individual turn. The conductor track arranged in the form of a spiral is surrounded by grounded lines, which are likewise realized in the first metallization plane. A second metal structure, which extends at least from the center of the first metal structure up to the edge of the first metal structure, is provided in the second metallization plane. The second metal structure is designed, for example, as a straight section. The second metal structure is electrically connected to the first metal structure by means of a contact hole filled with a contact. The contact hole is preferably arranged in the center of the conductor track arranged in the form of a spiral.

The coil consequently has a planar design, one connection of the coil being routed out of the coil via the second metal structure. In this embodiment, the width of the conductor track arranged in the form of a spiral is selected such that it is small compared with the occurring wavelength of the electromagnetic field.

According to a further embodiment of the invention, the integrated circuit structure comprises two passive components, of which one is designed as a capacitor and the other is designed as a coil. A resonator according to the invention, which resonator is designed for a frequency of 77 GHz, for example, has a length of approximately 150 μm and has an area requirement of less than 100 μm2. In comparison with this, a slot-type resonator for 77 GHz produced using coplanar technology would have a length of 1400 μm.

Since the passive components in the circuit structure according to the invention are constructed from metal structures arranged in two metallization planes, the structure width in the metal structures is given by the resolution which can be achieved during the structuring of metallization planes in the silicon process technology. Structure widths of around 1 μm can be achieved without difficulty in the art.

A further advantage of the integrated circuit structure according to the invention consists in the fact that further components, in particular the driving and evaluation electronics as well as electronics for digital processing, can additionally be produced in an integrated manner in the substrate.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures of which like reference numerals identify like elements, and in which:

DESCRIPTION OF THE PREFERRED EMBODIMENTS

Figure 1:
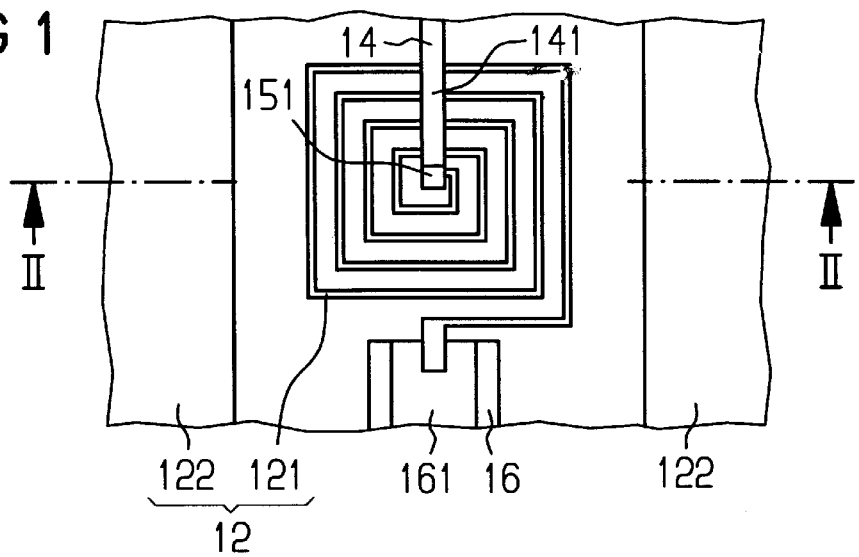
FIG. 1 and FIG. 2 show a plan view of and a section through a circuit arrangement having a coil.
Figure 2:
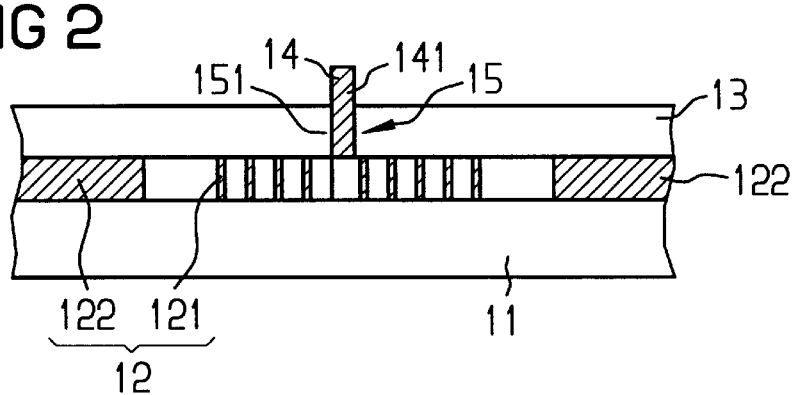

A first metallization plane 12, an insulation layer 13 and a second metallization plane 14 are arranged on a substrate 11 made of high-resistance monocrystalline silicon having a resistivity of, for example, 1000 Ωcm (see FIG. 1 and FIG. 2; FIG. 2 shows the section designated by II—II in FIG. 1). The insulation layer 13 is not illustrated in FIG. 1 for the sake of clarity.

The first metallization plane 12 comprises a first metal structure 121 and grounded lines 122. The first metallization plane 12 is composed of a metal, for example aluminum, gold, tungsten or doped polysilicon, which has a layer thickness of 1 μm.

The first metal structure 121 is designed as a conductor track arranged in the form of a spiral, the conductor track width being about 10 μm. An insulator, for example air or part of the insulation layer 13, is arranged between adjacent turns.

The first metal structure 121 is arranged between the grounded lines 122. The grounded lines 122 have a width of ≧50 μm, for example.

The insulation layer 13 is deposited from SiO2 and/or Si3N4 to a layer thickness of about 2 μm above the first metallization plane 12. The second metallization plane 14, which is formed from a metal, for example aluminum, gold, tungsten or doped polysilicon, to a layer thickness of about 1 μm, is applied to the insulation layer 13. A second metal structure 141 which runs above the first metal structure 121 is formed in the second metallization plane 14. The second metal structure 141 is designed, for example, as a straight section which extends from the center of the first metal structure 121 up to the edge of the first metal structure 121. The second metal structure 141 is electrically connected to the first metal structure 121 via a contact hole 15, which is filled with a contact 151 made, for example, of aluminum, gold, tungsten or doped polysilicon. The contact hole 15 is arranged approximately in the center of the first metal structure 121.

An active microwave component 16, for example an IMPATT diode or a fast transistor, is arranged in the substrate 11 and is electrically connected by one terminal 161, which is realized in the first metallization plane 12, to the first metal structure 121. Outside the drawing, a second terminal of the active microwave component 16 is connected to the grounded line 122.

Figure 3:
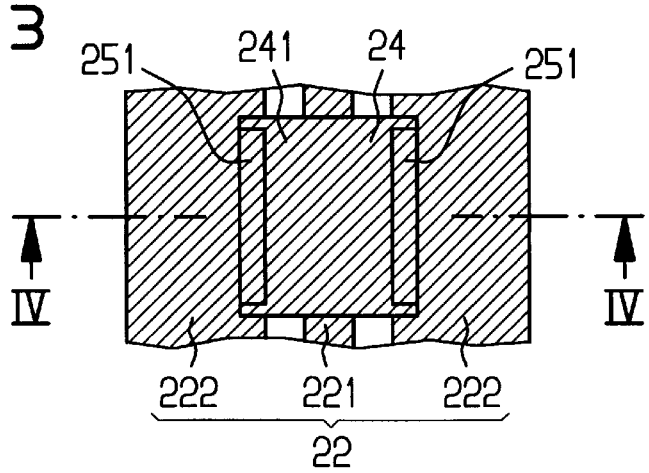
FIG. 3 and FIG. 4 show a plan view of and a section through a circuit arrangement having a capacitor.
Figure 4:
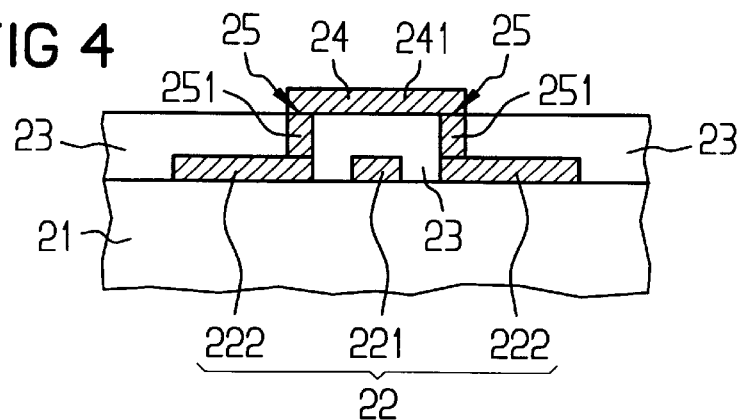

A first metallization plane 22, an insulation layer 23 and a second metallization plane 24 are arranged in a substrate 21 made of high-resistance monocrystalline silicon having a resistivity of, for example, 1000 Ωcm (see FIG. 3 and FIG. 4; FIG. 4 shows the section designated by IV—IV in FIG. 3).

The first metallization plane 22 comprises a first electrode 221 and grounded lines 222, between which the first electrode 221 is arranged. The first metallization plane 22 is formed to a layer thickness of 1 μm from a metal, for example aluminum, gold, tungsten or doped polysilicon. The first electrode 221 has a width of 25 μm, for example. The grounded lines 222 have a width of ≧50 μm, for example.

The insulation layer 23 is produced from SiO2 and/or Si3N4 to a layer thickness over the first metallization plane 22 of, for example, 2 μm.

The second metallization plane 24 comprises a second electrode 241 which laterally overlaps the first electrode 221. The second electrode 241 extends to a point over the grounded lines 222.

The second metallization plane 24 has a layer thickness of, for example, 1 μm and is composed of a metal, for example aluminum, gold, tungsten or doped polysilicon. The insulation layer 23, which is not illustrated in the plan view in FIG. 3 for the sake of clarity, has a thickness of 2 μm and is composed of SiO2 and/or Si3N4.

In the region where the second electrode 241 overlaps the grounded lines 22, contact holes 25 are respectively arranged on both sides of the first electrode 221, which holes are filled with contacts 251 made, for example, of aluminum, gold, tungsten or doped polysilicon. The second electrode 241 is electrically connected to the grounded lines 222 via the contacts 251.

The first electrode 221, the second electrode 241 and the insulation layer 23 which is arranged in between and acts as a capacitor dielectric form a capacitor, the second electrode 241 of which is grounded.

Outside the detail shown in FIG. 3 and FIG. 4, an active microwave component is integrated in the substrate 21.

Figure 5:
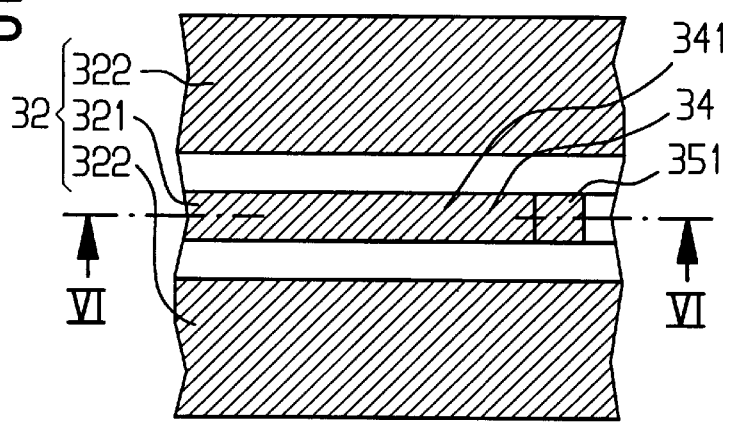
FIG. 5 and FIG. 6 show a plan view of and a section through a circuit arrangement having a capacitor.
Figure 6:
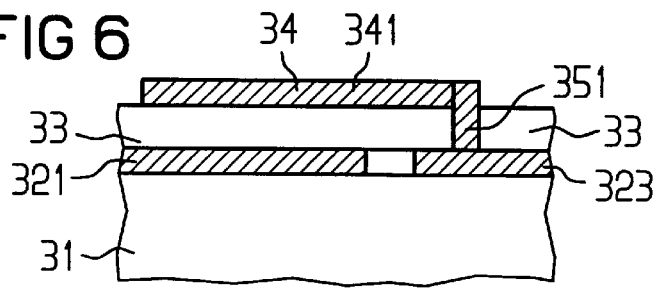

A first metallization plane 32, an insulation layer 33 and a second metallization plane 34 are arranged in a substrate 31 made of high-resistance monocrystalline silicon having a resistivity of, for example, 1000 Ωcm (see FIG. 5 and FIG. 6; FIG. 6 shows the section designated by VI—VI in FIG. 5).

The first metallization plane 32 is composed of a metal, for example aluminum, gold, tungsten or doped polysilicon, and has a thickness of 1 μm, for example. The first metallization plane 32 comprises a first electrode 321 and grounded lines 322, between which the first electrode 321 is arranged. The grounded lines 322 have a width of ≧50 μm, for example.

The insulation layer 33 is composed, for example, of SiO2 and/or Si3N4 and has a thickness of, for example, 2 μm. It is not illustrated in the plan view in FIG. 5 for the sake of clarity.

The second metallization plane 34 is composed of a metal, for example aluminum, gold, tungsten or doped polysilicon, and has a thickness of, for example, 1 μm. The second metallization plane 34 comprises a second electrode 341, which is arranged above the first electrode 321 and partially overlaps the first electrode 321.

A line section 323, between which and the first electrode 321 there is a spacing of about 15 μm, is furthermore realized in the first metallization plane 32. The second electrode 341 is arranged above this spacing and partially overlaps the line section 323. A contact hole 35, which is filled with a contact 351 made, for example, of aluminum or tungsten, is arranged in the region where the second electrode 321 overlaps the line section 323. The second electrode 341 is electrically connected to the line section 323 via the contact 351.

The first electrode 321, the second electrode 341 and the insulation layer 33 which is arranged in between and forms a capacitor dielectric form a capacitor which can be connected up via the line section 323 and the first electrode 321 in the first metallization plane 32.

Outside the detail shown in FIG. 5 and FIG. 6, an active microwave component is integrated in the substrate 31.

Figure 7:
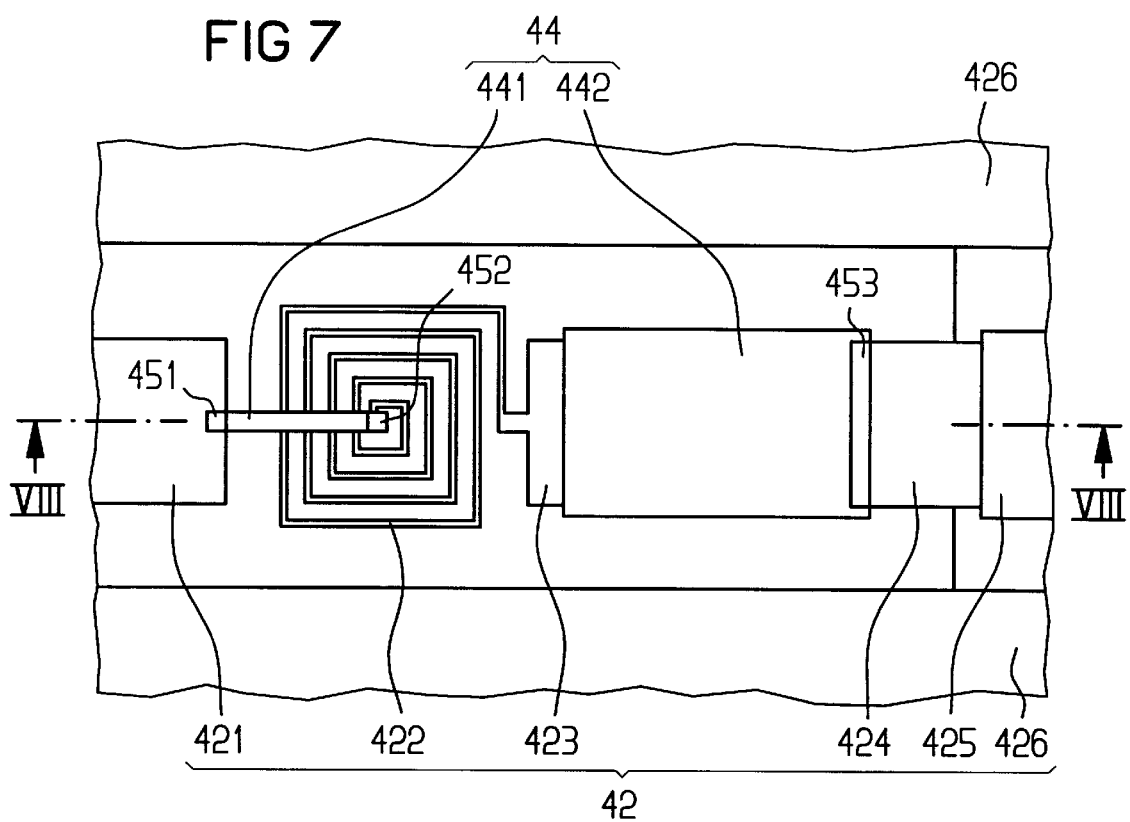
FIG. 7 and FIG. 8 show a plan view of and a cross-section through a circuit arrangement having a resonator.
Figure 8:
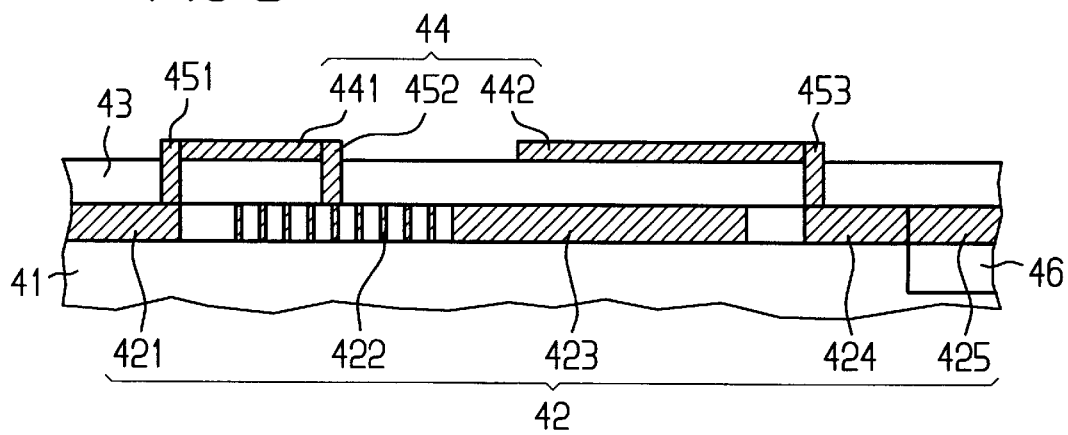

A first metallization plane 42, an insulation layer 43 and a second metallization plane 43 are arranged on a substrate 41 made of high-resistance monocrystalline silicon having a resistivity of, for example, ≧1000 Ωcm (see FIG. 7 and FIG. 8; FIG. 8 shows the section designated by VIII—VIII in FIG. 7).

The first metallization plane comprises a first line section 421, a conductor track 422 arranged in the form of a spiral, a first capacitor electrode 423, a second line section 424, a first terminal 425 for a microwave component 46 integrated in the substrate 41, as well as grounded lines 426 between which the first line section 421, the conductor track 422 arranged in the form of a spiral, the first capacitor electrode 423, the second conductor section 424 and the first terminal 425 are arranged. The conductor track 422 arranged in the form of a spiral has structure sizes of about 10 μm. The individual turns of the conductor track arranged in the form of a spiral have a rectangular cross-section. The first metallization plane 42 is composed of a metal, for example aluminum, tungsten or gold, and has a thickness of 1 μm, for example. The lines 422 have a width of 2 μm, for example.

The insulation layer 43 is composed, for example, of SiO2 and/or Si3N4 and has a thickness of, for example, 2 μm above the first metallization plane 42. It is not illustrated in FIG. 7 for the sake of clarity.

The second metallization plane 44 comprises a connection section 441 and a second capacitor electrode 442. The connection section 441 is arranged above the conductor track 422 arranged in the form of a spiral. It overlaps at least the region from the center of the conductor track 422 arranged in the form of a spiral up to the first line section 421. The first line section 421 is electrically connected to the connection section 441 via a first contact 451, which is arranged in a contact hole in the insulation layer 44. The connection section 441 is electrically connected to the conductor track 422 arranged in the form of a spiral in the first metallization plane 42 via a second contact 452, which is arranged in a contact hole arranged in the insulation layer. The conductor track 422 arranged in the form of a spiral is electrically connected to the first line section 421 via the connection section 441.

The second capacitor electrode 442 is arranged above the first capacitor electrode 423. The second capacitor electrode 442 projects laterally over the first capacitor electrode 423 and reaches a point over the second line section 424. The second capacitor electrode 442 at the same time projects over a gap which exists in the first metallization plane 42 between the first capacitor electrode 423 and the second line section 424.

A third contact 453 is arranged in a contact hole in the region where the second capacitor electrode 442 projects over the second line section 424, via which contact the second capacitor electrode 442 is electrically connected to the second line section 424.

The conductor track 422 arranged in the form of a spiral is electrically connected to the first capacitor electrode 423, with the result that the coil formed from the conductor track 422 arranged in the form of a spiral and the connection section 441 is connected between the first line section 421 and the first capacitor electrode 423. The first capacitor electrode 423 and the second capacitor electrode 442 as well as the insulation layer 43 arranged in between form a capacitor which is connected in series with the coil and with the second line section 424. The second line section 424 is electrically connected to the first terminal 425 of the active microwave component 46, for example of an IMPATT diode or a high-speed transistor. A second terminal of the microwave component 46, which is not illustrated in FIG. 7 and FIG. 8, is connected to the grounded lines 426.

The circuit arrangement, described with reference to FIGS. 7 and 8, with coil, capacitor and microwave component forms a coplanar series resonant circuit, in which the coil and capacitor act as a resonator. The area requirement of the resonator for operation at 77 GHz is less than 100 μm2. The length of the resonator is about 150 μm and is thus considerably less than the length of 1400 μm at 77 GHz which is required for a slot-type resonator.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. An integrated circuit structure comprising:
    an active microwave component and at least one passive component;
    the active microwave component being in a surface of a substrate made of high-resistance monocrystalline silicon;
    at least a first metallization plane and a second metallization plane, which are insulated from one another by an insulation layer, the first and second metallization planes arranged on the surface of the substrate;

the passive component having at least a first metal structure in the first metallization plane, and a second metal structure in the second metallization plane, the first metal structure being arranged between grounded lines, the grounded lines being in the first metallizing plane, the passive component being a capacitor, the first metal structure and the second metal structure forming a first electrode and a second electrode, respectively, of the capacitor and overlapping;

the first electrode being a signal line which runs between grounded lines, the second electrode being electrically connected to the grounded lines via two contact holes, provided with contacts, in the insulation structure on opposite sides of the signal line.

2. The circuit structure as claimed in claim 1, wherein the active component is one of an IMPATT diode, Gunn diode, heterojunction bipolar transistor or high-frequency MOS transistor.

3. The circuit structure as claimed in claim 1, wherein the high-resistance substrate has a resistivity of at least 1000 Ωcm.

4. An integrated circuit structure comprising:

an active microwave component and at least one passive component;

the active microwave component being in a surface of a substrate made of high-resistance monocrystalline silicon;

at least a first metallization plane and a second metallization plane, which are insulated from one another by an insulation layer, the first and second metallization planes arranged on the surface of the substrate;

the passive component having at least a first metal structure in the first metallization plane, and a second metal structure in the second metallization plane, the first metal structure being arranged between grounded lines, the grounded lines being in the first metallizing plane, the passive component being a capacitor, the first metal structure and the second metal structure forming a first electrode and a second electrode, respectively, of the capacitor and overlapping;

the first electrode being a signal line which is arranged between grounded lines, the second electrode overlapping the gap and electrically connected to the signal line, on a side of the gap which faces away from the first electrode, via a contact hole, provided with a contact, in the insulation layer.

5. The circuit structure as claimed in claim 4, wherein the active component is one of an IMPATT diode, Gunn diode, heterojunction bipolar transistor or high-frequency MOS transistor.

6. The circuit structure as claimed in claim 4, wherein the high-resistance substrate has a resistivity of at least 1000 Ωcm.

7. An integrated circuit structure comprising:

an active microwave component and two passive components;

the active microwave component being in a surface of a substrate made of high-resistance monocrystalline silicon;

at least a first metallization plane and a second metallization plane, which are insulated from one another by an insulation layer, the first and second metallization planes arranged on the surface of the substrate;

the passive component having at least a first metal structure in the first metallization plane, and a second metal structure in the second metallization plane, one of the first and second metal structures being arranged between grounded lines, the grounded lines being in the first metallizing plane;

the two passive components being a coil and a capacitor, respectively, the capacitor having two electrodes, of which one is in one metallization plane of the first and second planes and the other is in the other metallization plane of the first and second planes, the coil in the first metallization plane having a conductor track which is arranged in the form of a spiral and connected via a contact hole, provided with a contact, in the insulation layer, to a connection section which is in the other metallization plane and runs transversely with respect to the conductor track arranged in the form of a spiral;

the coil, the capacitor and the active microwave component connected in series along a signal line, the coil and the capacitor forming a resonator;

a first line section and a second line section arranged in the first metallization plane, which line sections run between grounded lines in the first metallization plane, the conductor track, arranged in the form of a spiral, of the coil being arranged in the first metallization plane between the first line section and the second line section, the connection section of the coil being arranged in the second metallization plane and being electrically connected to the first line section via a first contact, which is arranged in a contact hole, and is electrically connected to the conductor track, arranged in the form of a spiral, of the coil via a second contact, which is arranged in a contact hole, in the region of the center of a coil, a first capacitor electrode of the capacitor being arranged in the first metallization plane between the conductor track arranged in the form of a spiral and the second line section, which electrode is electrically connected to the conductor track, arranged in the form of a spiral, of the coil, a second capacitor electrode of the capacitor being arranged in the second metallization plane, which electrode overlaps the first capacitor electrode, and is connected to the second line section via a third contact, a first terminal of the active microwave component being electrically connected to one of the line sections and a second terminal of the active microwave component being electrically connected to the grounded lines.

* * * * *